(12) United States Patent
Ishii et al.

(10) Patent No.: US 6,657,151 B2
(45) Date of Patent: Dec. 2, 2003

(54) PLASMA PROCESSING DEVICE

(75) Inventors: Nobuo Ishii, Hyogo (JP); Kibatsu Shinohara, Kanagawa (JP)

(73) Assignees: Tokyo Electron Limited, Tokyo (JP); Nihon Koshuha Co., Ltd., Kanagawa (JP)

(*) Notice: Subject to any disclaimer, the term of this patent is extended or adjusted under 35 U.S.C. 154(b) by 271 days.

(21) Appl. No.: 09/879,205

(22) Filed: Jun. 13, 2001

(65) Prior Publication Data

US 2002/0036187 A1 Mar. 28, 2002

(30) Foreign Application Priority Data

Jun. 14, 2000 (JP) .......................... 2000-178821

(51) Int. Cl.[7] .............................................. B23K 10/00
(52) U.S. Cl. ........................... 219/121.43; 219/121.44; 219/747; 204/298.38
(58) Field of Search ................. 219/121.43, 121.4, 219/121.41, 121.44, 121.52, 747; 118/723 MR, 723 MC, 723 MP, 723 MW, 723 AN; 204/298.38, 298.11; 156/345.31, 345.36, 345.37, 345.41; 438/709, 711, 718, 726, 485

(56) References Cited

U.S. PATENT DOCUMENTS 5,387,288 A * 2/1995 Shatas ................... 118/723 AN
5,874,706 A * 2/1999 Ishii et al. ............. 219/121.43
6,325,018 B1 * 12/2001 Hongoh ................. 118/723 AN

* cited by examiner

Primary Examiner—Quang T. Van

(57) ABSTRACT

To uniformly generate plasma using microwaves in a processing vessel. To first to fourth feeding sections 141a to 141d which are evenly placed on the same plane perpendicular to an axial direction of a main coaxial line 123, four microwaves shifted in phase by 0°, 90°, 180°, and 270° are fed from first to fourth microwave supply sections 142a to 142d.

22 Claims, 7 Drawing Sheets

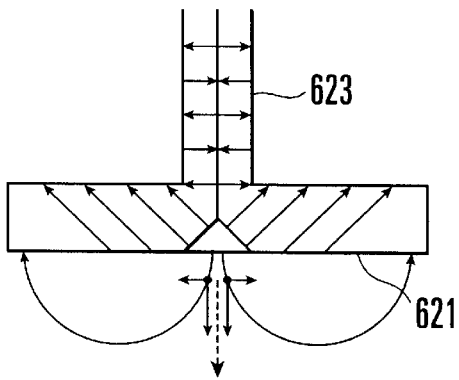
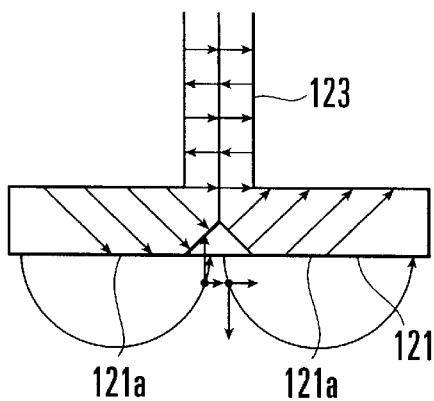
FIG.4A   FIG.4B
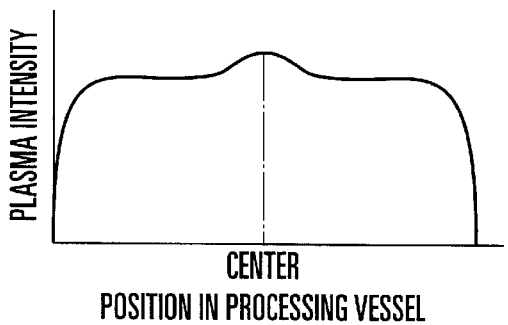
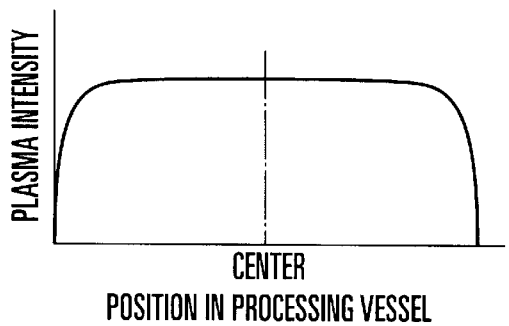
FIG.4C   FIG.4D
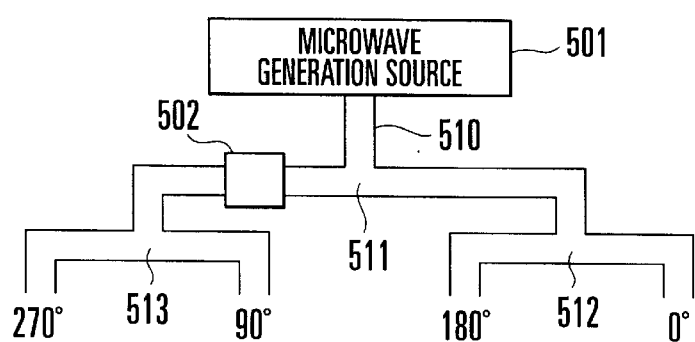
FIG.5

$\alpha$ : INNER CONDUCTOR RADIUS
$\beta$ : OUTER CONDUCTOR RADIUS $$v = \frac{\alpha + \beta}{2}$$

DOTTED LINE INDICATES EFFECTIVE PERIPHERY LENGTH OF COAXIAL LINE

PLASMA PROCESSING DEVICE

BACKGROUND OF THE INVENTION

The present invention relates to a plasma processing device for generating plasma with microwaves and performing a processing such as etching, ashing, film-forming, and film-reformation in manufacturing of a semiconductor device.

In manufacturing of a semiconductor device, a plasma device is frequently used for the formation of an oxide film, crystal growth on a semiconductor layer, and a processing such as etching and ashing. One of such plasma devices is a microwave plasma device capable of generating plasma with stability even at a relatively low pressure. In such a microwave plasma device, microwaves are introduced into a processing vessel through a flat antenna to generate high-density plasma.

Referring to FIG. 11, the above plasma device used for an etching device will be described as one example. The etching device is provided with a cylindrical processing vessel 901 whose side wall and bottom are made of a conductive material such as aluminum, and an insulating plate 902 which is disposed on the upper part of the processing vessel 901 and is made of a material such as quartz. The processing vessel 901 and the insulating plate 902 constitute a closed vessel. The closed vessel is evacuated from air outlets 903, which are formed on the bottom of the processing vessel 901, by an evacuating means (not shown) connected to the air outlets 903 so as to set the inside of the vessel at a prescribed degree of vacuum.

In the enclosed vessel, there are provided a loading base 904 having a substrate to be etched thereon, a supporting base 905 including a cooling means for supporting the loading base 904, and an insulating plate 906. The insulating plate 906 is fixed on the bottom of the processing vessel 901, the supporting base 905 is fixed on the insulating plate 906, and the loading base 904 is fixed on the supporting base 905. The loading base 904 is connected to a matching box 908 via a feeding line 907, and the matching box 908 is connected to a high-frequency power source 909 for bias. The high-frequency power source 909 produces a high frequency such as 13.56 MHz.

Further, desired etching gas is introduced into the processing vessel 901 through an introducing tube 910.

Meanwhile, a flat antenna 921 is placed on the insulating plate 902. The flat antenna 921 is formed as a bottom plate of a waveguide box 922, which is composed of a vessel formed into a short and hollow circular cylinder. A coaxial line 923 is connected to the center of the waveguide box 922 formed into a disk, and an inner conductor 924 placed in the coaxial line 923 is connected to the center of the flat antenna 921 formed into a disk. The other terminals of the coaxial line 923 and the inner conductor 924 are connected to a microwave generator 925. Moreover, the waveguide box 922 includes a conductor 926 with a prescribed permittivity that shortens a wavelength of a microwave to obtain a short in-tube wavelength.

In the above plasma device, firstly, the processing vessel 901 is evacuated to a degree of vacuum such as 0.01 to 10 Pa. And then, etching gas is introduced with a prescribed quantity into the processing vessel 901 from the introducing tube 910. When the etching gas is introduced into the processing vessel 901, a microwave with a frequency such as 2.45 GHz is generated from the microwave generator 925. The microwave is transported to the coaxial line 923 and the waveguide box 922 and is introduced from the flat antenna 921 into the processing vessel 901 via the insulating plate 902, and plasma is generated from the etching gas. Additionally, since bias high-frequency power is applied to the loading base 904, a negative potential is generated on the loading base 904 and ions are drawn out of the produced plasma.

However, the above conventional plasma processing device does not evenly generate plasma. When observing plasma generated in the processing vessel by the above plasma processing device, it is found that a region under the center of the flat antenna has a higher density than the surrounding regions. Therefore, the conventional device is irregular in processing quantity. For example, etching proceeds faster in a region under high-density plasma of a substrate to be processed. The substrate to be processed, a central axis of the loading base for loading the substrate, and a central axis of the flat antenna are generally aligned with a central axis of the cylindrical processing vessel. For this reason, the conventional device has been disadvantageous in that etching proceeds faster at the center of the substrate to be processed.

SUMMARY OF THE INVENTION

It is an object of the present invention to provide a plasma processing device for evenly generating plasma by using microwaves in the processing vessel.

In order to achieve the above object, according to the present invention, there is provided a plasma processing device with a loading base for loading a processed substrate placed in an airtight processing vessel, a flat antenna opposed to the loading base, a main coaxial line having one end connected to the flat antenna and the other end short-circuited, a plurality of feeding sections placed on the peripheral surface of the main coaxial line on the same plane perpendicular to an axial direction of the main coaxial line, the feeding sections receiving microwaves shifted in phase along the same circumferential direction, and a microwave supply means for feeding microwaves with the same prescribed frequency to the plurality of feeding sections.

According to the above invention, a high-order mode is excited in microwaves propagated through the main coaxial line.

In the above invention, phase delay of the feeding section adjacent to another in the same circumferential direction is preferably set at natural number-times as much as an angle of the feeding section and the adjacent feeding section, with respect to the intersection of the center line of the main coaxial line and the same plane having the feeding sections thereon. Further, an angle of the feeding section and the adjacent feeding section is preferably set at {360/(M+1)}° (M is the number of feeding sections) or more with respect to the intersection of the center line of the main coaxial line and the same plane having the feeding sections thereon. Moreover, the microwave supply means may be provided in the same number as the feeding sections so as to correspond to the feeding sections, and the feeding means may be synchronized with each other to feed microwaves to the corresponding feeding sections.

In the above invention, the feeding sections may be evenly placed on the peripheral surface of the main coaxial line. In the case where the feeding sections are evenly disposed on four parts of the peripheral surface of the main coaxial line, the microwave supply means is preferably constituted by a microwave generation source; a main branch means for branching a microwave outputted from the microwave generation source into two branched microwaves shifted in phase by 180°; phase delay means for delaying one of the branched microwaves, which are branched by the branch means, in phase by 90° from the other branched microwave; and two sub branch means for branching each of the branched microwaves into two supply microwaves shifted in phase by 180°. One of the branched microwaves is branched by the main branch means, and the other branched microwave is delayed in phase by the phase delay means.

Further, in the above invention, the main coaxial line is short-circuited from the feeding sections at $(2N-1)\cdot\lambda_g/4$ (N is a natural number) where $\lambda_g$ is a wavelength of the main coaxial line of microwaves supplied by the microwave supply means.

BRIEF DESCRIPTION OF THE DRAWINGS

FIGS. 4A and 4B are explanatory drawings each showing an electric field of microwaves radiated from the flat antenna, and FIGS. 4C and 4D are diagrams each showing a distribution of plasma generated by microwaves;

FIG. 5 is a structural drawing showing the configuration of a microwave supply means according to another embodiment of the present invention;

DESCRIPTION OF THE PREFERRED EMBODIMENTS

Figure 1A:
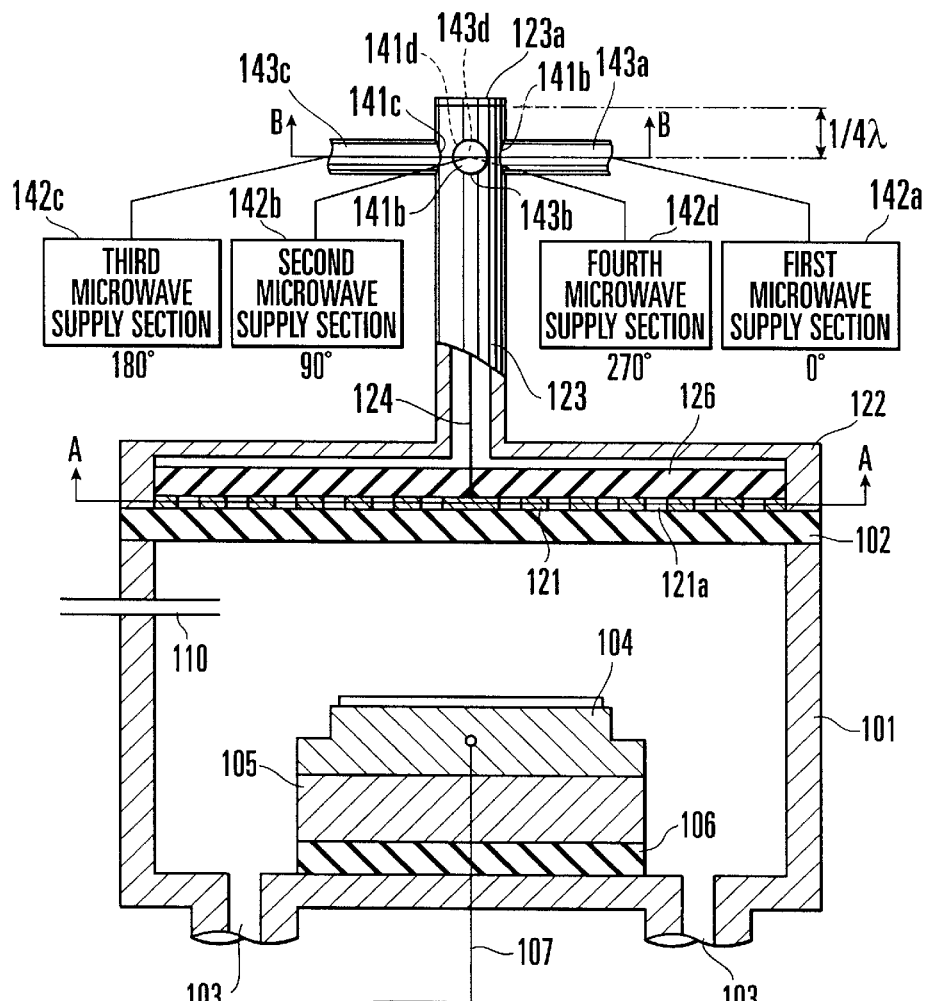
FIGS. 1A and 1B are sectional views showing the configurations of a plasma processing device according to one embodiment of the present invention and a flat antenna, respectively.

Referring to the drawings, preferred embodiments of the present invention will be described below.
(First Embodiment)

Figure 1B:
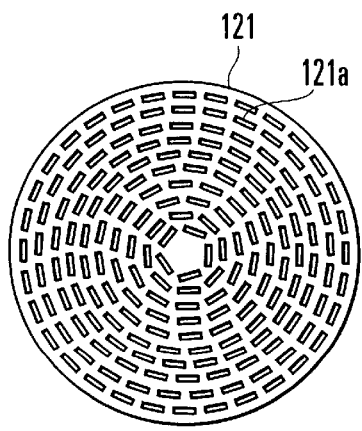

FIG. 1 is a sectional view schematically showing the configuration of a microwave processing device according to one embodiment of the present invention. Hereinafter, a case of using the present invention as an etching device is taken by way of one example. Besides, FIG. 1B is a sectional view taken along line AA shown in FIG. 1A. Further, in the present embodiment, a case will be described where four feeding sections are evenly placed on the peripheral surface of a main coaxial line.

First, the configuration of the etching device will be described according to the present embodiment. The etching device is provided with a cylindrical processing vessel 101 whose side wall and bottom are made of a conductive material such as aluminum, and an insulating plate 102 which is disposed on the cylinder and is made of a material such as quartz. The processing vessel 101 and the insulating plate 102 constitute a closed vessel. The closed vessel is evacuated from air outlets 103, which are formed on the bottom of the processing vessel 101, by an evacuating means (not shown) connected to the air outlets 103 so as to set the inside of the vessel at a prescribed degree of vacuum.

In the closed vessel, there are provided a loading base 104 having a substrate to be etched thereon, a supporting base 105 including a cooling means for supporting the loading base 104, and an insulating plate 106. The insulating plate 106 is fixed on the bottom of the processing vessel 101, the supporting base 105 is fixed on the insulating plate 106, and the loading base 104 is fixed on the supporting base 105. The loading base 104 is connected to a matching box 108 via a feeding line 107, and the matching box 108 is connected to a high-frequency power source 109 for bias. The high-frequency power source 109 generates a high frequency such as 13.56 MHz. Further, desired etching gas is introduced into the processing vessel 101 through an introducing tube 110.

Meanwhile, a flat antenna 121 formed into a metallic disk is provided on the insulating plate 102. As shown in FIG. 1B, the flat antenna 121 is provided with a plurality of slots 121a. Further, the flat antenna 121 is formed as the bottom of a waveguide box 122, which is composed of a vessel formed into a short and hollow circular cylinder. A main coaxial line 123 is connected to the center of the waveguide box 122 formed into a disk, and an inner conductor 124 in the coaxial line is connected to the center of the flat antenna 121 formed into a disk. Besides, the waveguide box 122 includes a dielectric 126 with a prescribed permittivity that shortens a wavelength of a microwave to generate an in-tube wavelength.

Microwaves are fed to the main coaxial line 123 from a first microwave supply section 142a, a second microwave supply section 142b, a third microwave supply section 142c, and a fourth microwave supply section 142d that feed microwaves with an equal frequency via a first feeding section 141a, a second feeding section 141b, a third feeding section 141c, and a fourth feeding section 141d that are evenly placed on the peripheral surface of the main coaxial line 123 on the same plane perpendicular to an axial direction of the main coaxial line 123. The first to fourth feeding sections 141a to 141d and the first to fourth microwave supply sections 142a to 142d are connected to each other respectively via coaxial lines 143a to 143d. Microwaves fed from the feeding sections are set at a frequency such as 2.45 GHz.

Besides, microwaves supplied from the second to fourth microwave supply sections 142b to 142d are each shifted in phase by 90°, 180°, and 270° from a microwave supplied by the first microwave supply section 142a. Additionally, the main coaxial line 123 is short-circuited by a metallic plate 123a at a length one fourth of a wavelength of a microwave in the main coaxial line. The microwave is supplied from the feeding section by the microwave supply section. This is because resonance occurs and efficiency is improved at $(2N-1)\cdot\lambda_g/4$ where N represents a natural number and $\lambda_g$ represents a wavelength of a microwave in the main coaxial line.

In plasma generation using the above etching device according to the present embodiment, firstly, the processing vessel 101 is evacuated to a degree of vacuum of about 0.01 to 10 Pa, and then, etching gas is introduced into the processing vessel 101 with a prescribed quantity from the introducing tube 110. When the etching gas is introduced into the processing vessel 101, microwaves supplied from the microwave supply sections 142a to 142d are propagated to the coaxial lines 143a to 143d, the main coaxial line 123, and the waveguide box 122. The microwaves are introduced from the flat antenna 121 into the processing vessel 101 via the insulating plate 102. Plasma of etching gas is generated by the microwaves introduced into the processing vessel 101. Moreover, in the etching device, since bias high-frequency power is applied to the loading base 104, a negative potential is produced on the loading base 104 and ions are drawn out of the generated plasma.

Figure 2:
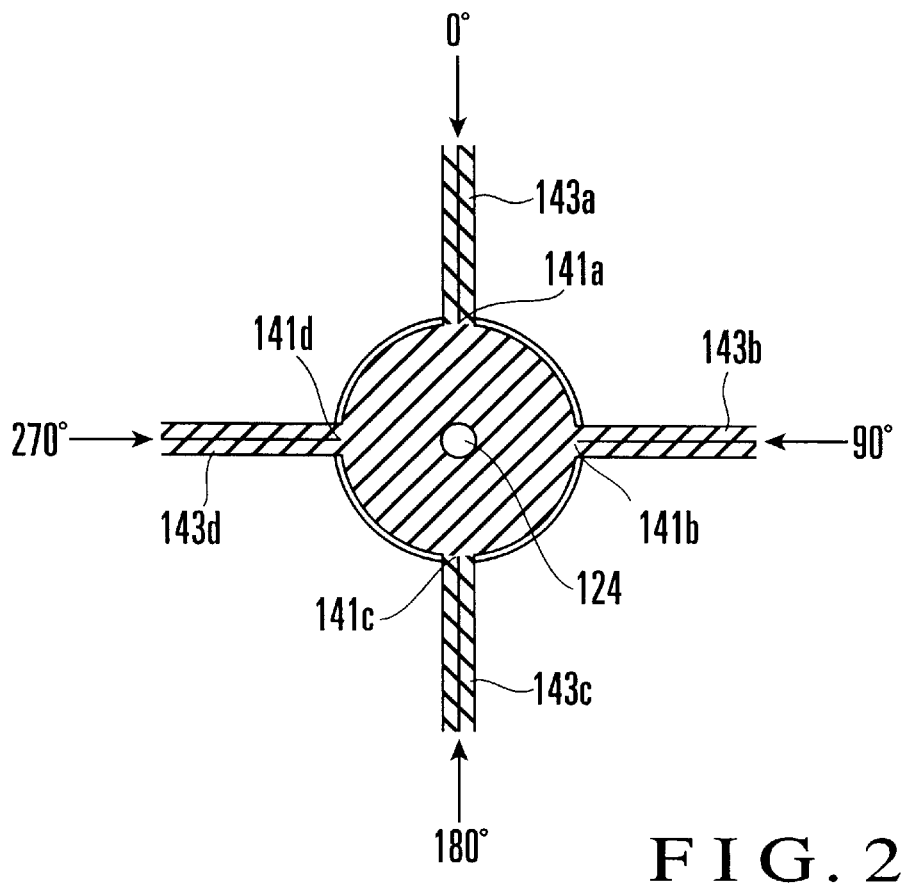
FIG. 2 is a sectional view taken along line BB shown in FIG. 1.

As shown in a sectional view of FIG. 2, according to the present embodiment, the first to fourth feeding sections 141a to 141d are provided on the same plane perpendicular to an axial direction of the main coaxial line 123, and the feeding sections are connected to the coaxial lines 143a to 143d, respectively. Here, FIG. 2 is a sectional view taken along line BB shown in FIG. 1. A microwave of a frequency such as 2.45 GHz is fed from the first microwave supply section to the coaxial line 143a. Also, a microwave with the same frequency is shifted in phase by 90 from a microwave wave-guided to the coaxial line 143a and is fed to the coaxial line 143b. Besides, a microwave with the same frequency is shifted in phase by 180° from a microwave wave-guided to the coaxial line 143a and is fed to the coaxial line 143c. In the same manner, a microwave with the same frequency is shifted in phase by 270° from a microwave wave-guided to the coaxial line 143a and is fed to the coaxial line 143d. Namely, microwaves shifted in phase by 90° are fed to the two adjacent feeding sections with an equal frequency.

Figure 3:
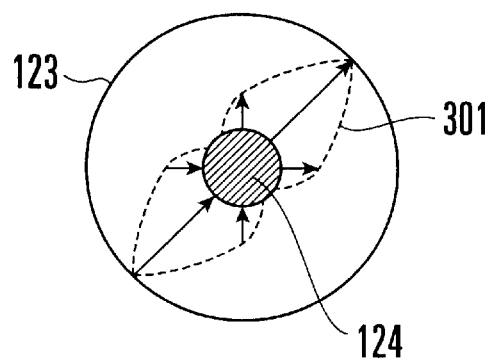
FIG. 3 is an explanatory drawing showing the distribution of an electric field on a main coaxial line 123 shown in FIG. 1.

Since feeding is made to the main coaxial line 123 in the above manner, a high-order mode is excited as shown in FIG. 3 on a microwave wave-guided to the main coaxial line 123. FIG. 3 shows a state of an electric field on cross section of the main coaxial line 123 at some point in time. In the main coaxial line fed in the above manner, an electric field is distributed like distribution 301 indicated by a dotted line.

Consequently, according to the present embodiment, as shown in FIG. 4B, electric fields from the two slots 121a, which are symmetric with respect to the center of the flat antenna 121, are components applied in the same direction. In contrast, as shown in FIG. 4A of the conventional art, electric fields from slots are components applied in directions 180° different from each other. The slots are symmetric with respect to the center of the flat antenna 621.

As shown in FIG. 4A, like conventional art, in the case where two electric fields are components applied in directions 180° different from each other, since vertical components of the two electric fields are applied in the same direction at the center of the flat antenna 621, the components strengthen each other. Hence, as shown in FIG. 4C, regarding the distribution of plasma generated in the processing vessel, the intensity is high at the center of the processing vessel, that is, the center of the flat antenna.

In contrast, in the present embodiment, two electric fields from the symmetric slots are applied in the same direction.

Thus, as shown in FIG. 4B, vertical components of the two electric fields are applied in directions 180° different from each other at the center of the flat antenna 121, and the vertical components balance each other out. Also, from a different aspect, the distribution of vertical components will be discussed regarding the electric fields fed from the four feeding sections at the center of the main coaxial line. At a certain time, for example, a component from the first feeding section is 1, a component from the second feeding section is 0, a component from the third feeding section is −1, and a component from the fourth feeding section is 0. Hence, in the present embodiment, a synthetic electric field Ez of a vertical component is 0 at the center of the main coaxial line.

Thus, as shown in FIG. 4D, regarding the distribution of plasma generated in the processing vessel, the intensity is uniform on most regions of the processing vessel.

Incidentally, the above embodiment uses the four different microwave supply sections to feed four microwaves to the four feeding sections evenly placed on the same plane perpendicular to the axial direction of the main coaxial line. The microwaves are shifted in phase by 0°, 90°, 180°, and 270° with an equal frequency. An applicable arrangement is not limited to the above. As shown in FIG. 5, a single microwave generating source 501, a 90°-phase delay means 502, and a rectangular waveguide 510 may generate and feed four microwaves shifted in phase by 0°, 90°, 180°, and 270°.

The following will discuss the microwave supply means of FIG. 5.

A microwave generated from the microwave generating source 501 is firstly branched into a 0°-phase microwave and a 180°-phase microwave, which is shifted in phase by 180° from the 0°-phase microwave, at a T-shaped branch point (main branch means) 511 of the rectangular waveguide 510. In the case of a rectangular waveguide, a microwave wave-guided inside is at a TE mode and is naturally in opposite in phase (shifted by 180°) at the T-shaped branch point. Thus, the microwave is wave-guided in directions 180° different from each other.

The 180°-phase microwave branched at the T-shaped branch point 511 is transformed into a 90°-phase microwave by the 90°-phase delay means (phase delay means) 502, and the microwave is branched into a 90°-phase microwave and a 270°-phase microwave, which is shifted in phase by 180° from the 90°-phase microwave, at a T-shaped branch point (sub branch means) 512. Further, the 0°-phase microwave branched at the T-shaped branch point 511 is branched into a 0°-phase microwave and a 180°-phase microwave, which is shifted in phase by 180° from the 0°-phase microwave, at a T-shaped branch point (sub branch means) 513.

With the above arrangement, the microwave supply means of FIG. 5 can generate four microwaves, which are shifted in phase by 0°, 90°, 180°, and 270° from a single microwave generation source. In this case, four microwave output sections at the ends of the T-shaped branch points 512 and 513 correspond to the above first to fourth microwave supply sections.

In the case where four microwaves shifted in phase by 0°, 90°, 180°, and 270° are generated by using four different microwave supply sections like the above embodiment, it is necessary to synchronize the four microwave supply sections. However, as shown in FIG. 5, microwaves with different phases are generated from a single microwave generation source. Thus, it is possible to eliminate the need for synchronization and to manufacture the device at low cost.

(Embodiment 2)

Next, another embodiment of the present invention will be described. According to the foregoing embodiment, the feeding sections are placed evenly on four parts of the peripheral surface of the main coaxial line. An applicable arrangement is not limited to the above. For example, the feeding sections are placed evenly on three parts.

Figure 6A:
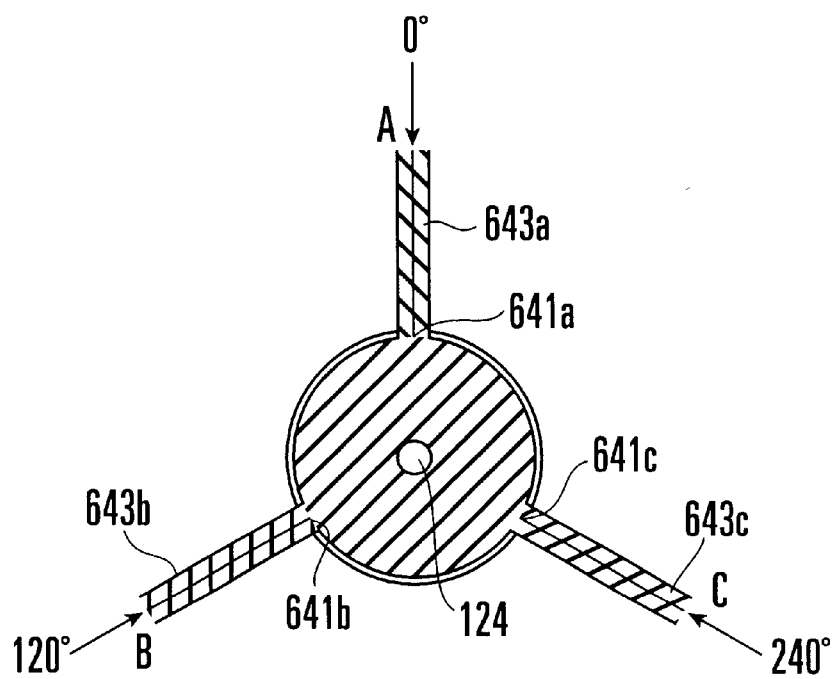
FIG. 6A is a sectional view partially showing the configuration of a plasma processing device according to another embodiment of the present invention.

FIG. 6A is a sectional view showing a main coaxial line 123, three feeding sections 641a, 641b, and 641c evenly placed on the peripheral surface of the main coaxial line 123, and coaxial lines 143a, 143b, and 143c connected to the feeding sections. The feeding sections 641a, 641b, and 641c are evenly placed at an interval of 120° on the peripheral surface of the main coaxial line 123. A microwave shifted in phase from the feeding section 641a is fed to the feeding section 641b, and a microwave shifted in phase from the feeding section 641a is fed to the feeding section 641c.

Additionally, like the foregoing embodiment, microwaves with an equal frequency are supplied from the microwave supply sections to coaxial lines (not shown). However, in the case of the present embodiment, microwaves each shifted in phase by 120° are supplied from the microwave supply sections. Here, another configuration (not shown) is identical to that of FIG. 1. A case of using the present invention as an etching device is taken by way of one example in the present embodiment.

Figure 6B:
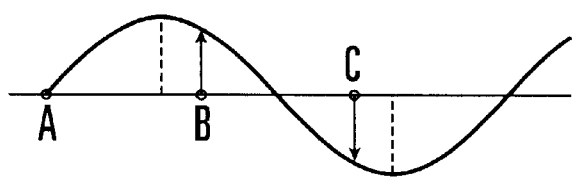
FIGS. 6B and 6C are explanatory drawings each showing a distribution of an electric field.
Figure 6C:
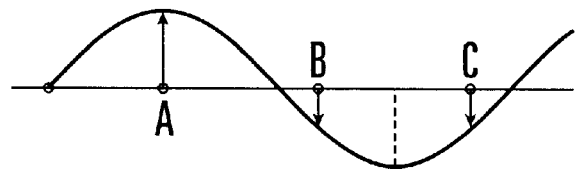

According to the present embodiment, regarding an electric field on the main coaxial line 123 that is generated by microwaves A, B, and C supplied from the three microwave supply sections, as shown in FIG. 6B, when the microwave A has a phase of 0° and an electric field of "0" at the center of the main coaxial line, the microwaves B and C have electric fields which are opposite in sign with an equal absolute value. The sum of the electric fields is "0". Further, as shown in FIG. 6C, when the microwave A has a phase of 90° and an electric field of "1" at the center of the main coaxial line, the microwaves B and C each have an electric field of "−0.5". The sum of the electric fields is "0". As shown in the above cases, in the present embodiment as well, a vertical component (Ez) of a synthetic electric field is 0 at the center.

Besides, when the three feeding sections are evenly placed on the peripheral surface of the main coaxial line, it is found that a vertical component (Ez) of a synthetic electric field is 0 at the center of the main coaxial line according to the following equation.

$$\begin{aligned}
Ez &= \sin A + \sin B + \sin C \\
&= \sin A + \sin(A - 120) + \sin(A - 240) \\
&= \sin A + \sin(A + 60 - 180) + \sin(A - 60 - 180) \\
&= \sin A - \sin(A + 60) - \sin(A - 60) \\
&= \sin A - \{\sin(A + 60) + \sin(A - 60)\} \\
&= \sin A - 2\sin A \cos 60 \\
&= \sin A - \sin A \\
&= 0
\end{aligned}$$

Therefore, at the center of the flat antenna 121 shown in FIG. 1, the electric field components Ez balance each other out. Hence, regarding the distribution of plasma generated in the processing vessel 101, the intensity is even on most regions in the processing vessel 101.

In the present embodiment, the three feeding sections are evenly placed on the peripheral surface of the main coaxial line. The same effect can be achieved by evenly placing five feeding sections on the peripheral surface of the main coaxial line. In the case where five feeding sections are evenly placed on the peripheral surface of the main coaxial line, a synthetic electric field Ez is 0 at the center of the main coaxial line according to the following equation. Here, computing is carried out when a phase of the feeding section is delayed in an opposite direction from the above embodiment on the peripheral surface.

$$\begin{aligned}
Ez &= \sin A + \sin(A + 72) + \sin(A + 144) + \sin(A + 216) + \sin(A + 288) \\
&= \sin A + \sin(A - 18 + 90) + \sin(A - 36 + 180) + \sin(A + 36 + 180) + \\
&\quad \sin(A + 18 + 270) \\
&= \sin A + \cos(A - 18) - \sin(A - 36) - \sin(A + 36) - \cos(A + 18) \\
&= \sin A + \{\cos(A - 18) - \cos(A + 18)\} - \{\sin(A - 36) + \sin(A + 36)\} \\
&= \sin A + 2\sin A \sin 18 - 2\sin A \cos 36 \\
&= \sin A + 0.618\sin A - 1.618\sin A \\
&= 0
\end{aligned}$$

As described in the above explanation, in the case where four feeding sections are evenly placed on the peripheral surface of the main coaxial line, phase delay is 360°/4=90° regarding the feeding section adjacent to another in the same circumferential direction. In the case where three feeding sections are evenly placed on the peripheral surface of the main coaxial line, phase delay is 360°/3=120° regarding the feeding section adjacent to another in the same circumferential direction. In the case where five feeding sections are evenly placed on the peripheral surface of the main coaxial line, phase delay is 360°/5=72° regarding the feeding section adjacent to another in the same circumferential direction. In the above case, a synthetic electric field Ez is "0" at the center of the main coaxial line. Namely, in the case where M feeding sections (M is a natural number of 2 or more) are evenly placed on the peripheral surface of the main coaxial line, phase delay is 360°/M regarding the feeding section adjacent to another in the same circumferential direction. Thus, the same effect can be achieved as the above embodiment.

(Embodiment 3)

Next, another embodiment of the present invention will be discussed. In the above embodiment, the feeding sections are evenly placed on the peripheral surface of the main coaxial line. An applicable arrangement is not limited to the above. Hereinafter, a case of placing three feeding sections at different intervals will be taken by way of one example.

Figure 7A:
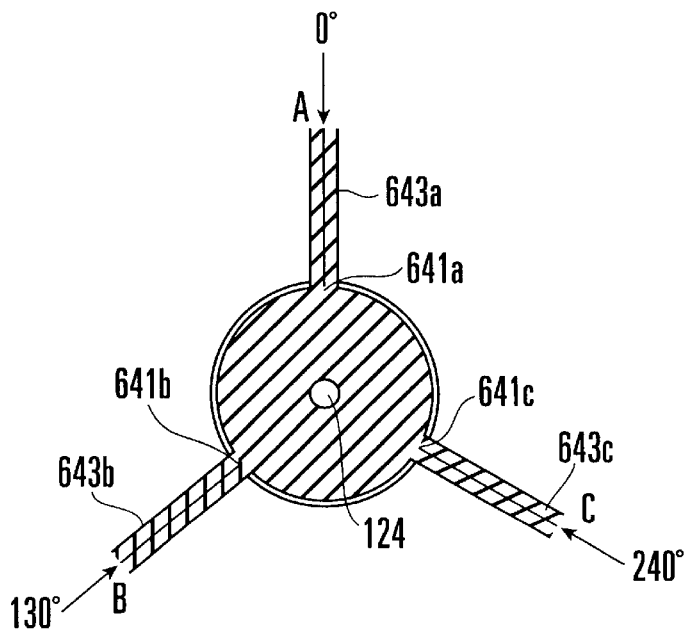
FIG. 7A is a sectional view partially showing the configuration of a plasma processing device according to another embodiment of the present invention.

FIG. 7A is a sectional view showing a main coaxial line 123, three feeding sections 741a, 741b, and 741c placed on the peripheral surface of the main coaxial line 123, and coaxial lines 143a, 143b, and 143c connected to the feeding sections, according to the present embodiment.

In the present embodiment, the feeding sections are placed unevenly. An angle of the feeding section 741a and the adjacent feeding section 741b is 130° with respect to the intersection of a center line of the main coaxial line 123 and the same plane having the feeding sections thereon. Further, an angle of the feeding section 741a and the adjacent feeding section 741c is 240° with respect to the intersection of the center line of the main coaxial line 123 and the same plane having the feeding sections thereon.

Additionally, in the present embodiment, a microwave shifted in phase by 130° from the feeding section 741a is fed to the feeding section 741b, and a microwave shifted in phase by 240° from the feeding section 741a is fed to the feeding section 741c.

Here, like the foregoing embodiment, microwaves with an equal frequency are supplied from the microwave supply sections to the coaxial lines (not shown). Moreover, another configuration (not shown) is identical to FIG. 1. A case of using the present invention as an etching device is taken by way of one example in the present embodiment.

Figure 7B:
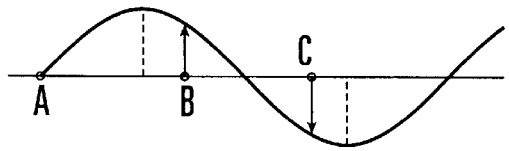
FIG. 7B is an explanatory drawing showing a distribution of an electric field, according to another embodiment of the present invention.

According to the present embodiment, regarding an electric field on the main coaxial line 123 that is generated by microwaves A, B, and C supplied from the three microwave supply sections, as shown in FIG. 7B, when the microwave A has a phase of 0° and an electric field of "0" at the center of the main coaxial line, the microwaves B and C have electric fields which are opposite in sign. Therefore, even when the feeding sections are not evenly placed, the intensity of a vertical component Ez of a synthetic electric field is reduced at the center of the main coaxial line 123 as compared with the foregoing conventional art.

In the same manner, in the case where n feeding sections (n is a natural number of 2 or more) are placed on the peripheral surface of the main coaxial line, phase delay of the feeding section adjacent to another in the same circumferential direction is equal to an angle of the feeding section and the adjacent one, with respect to the intersection of the center line of the main coaxial line and the same plane having the feeding sections thereon. In this case, the intensity of the synthetic electric field Ez at the center of the main coaxial line is reduced as compared with the foregoing conventional art. However, it is better to set an angle of the feeding sections at $\{360/(M+1)\}°$ (M is the number of the feeding sections) or more with respect to the intersection of the center line of the main coaxial line and the same plane having the feeding sections thereon. If the angle is too small, it is not possible to obtain a remarkable effect of reducing the intensity of the synthetic electric field Ez.

Figure 8:
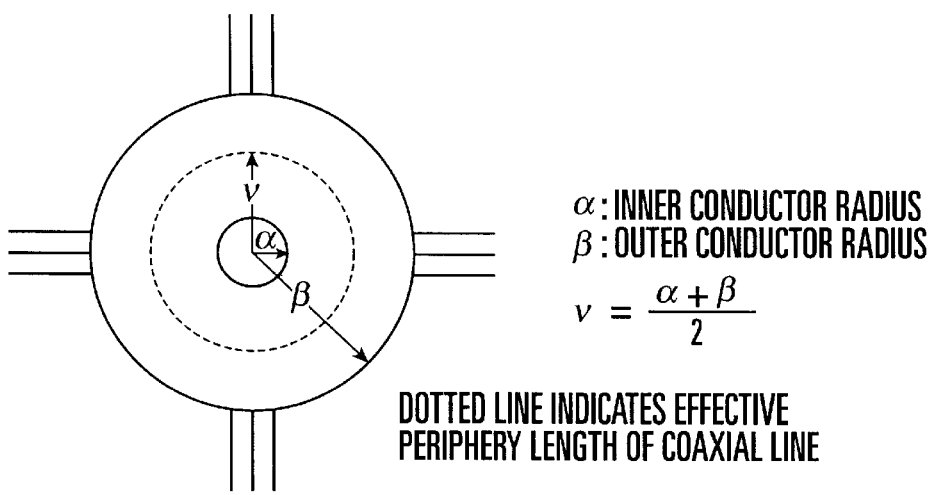
FIG. 8 is an explanatory drawing showing an effective periphery length of a main coaxial line.

Incidentally, in the above embodiment, a phase difference of the circumference of the main coaxial line is 360° regarding a plurality of feeding sections, and an effective periphery length (FIG. 8) of the main coaxial line is substantially equal to a wavelength (about $\lambda_g$ to 1.5 $\lambda_g$ is preferable). An applicable arrangement is not limited to the above. For example, in the case where four feeding sections are evenly placed on the peripheral surface of the main coaxial line, phase delay may be set at 720°/4=180° regarding the feeding section adjacent to another in the same circumferential direction.

Figure 9:
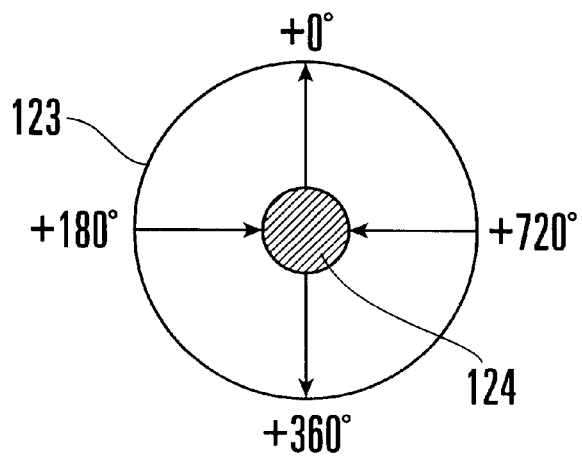
FIG. 9 is an explanatory drawing showing a distribution of an electric field in a main coaxial line of a plasma processing device according to another embodiment of the present invention.

In this case, when an effective periphery length of the main coaxial line is about two wavelengths (about 2 $\lambda_g$ to 2.5 $\lambda_g$ is preferable), an electric field has an intensity shown in FIG. 9 at the center of microwaves fed from four feeding sections, and the intensity of a vertical component Ez is 0 on a synthetic electric field at the center of the main coaxial line 123.

As described above, in the case where M feeding sections are placed on the peripheral surface of the main coaxial line, when phase delay of the feeding section adjacent to another in the same circumferential direction is L (natural number) times an angle of the feeding section and the adjacent one, with respect to the intersection of the center line of the main coaxial line and the same plane having the feeding sections thereon, the same effect can be obtained like the above embodiment. In this case, an effective periphery length of the main coaxial line is preferable at about $L \times \lambda_g$ to $(L+1) \times \lambda_g$, particularly at about $L \times \lambda_g$ to $\{L+(1/2)\} \times \lambda_g$. $\lambda_g$ is a wavelength of a microwave in the main coaxial line.

Figure 10:
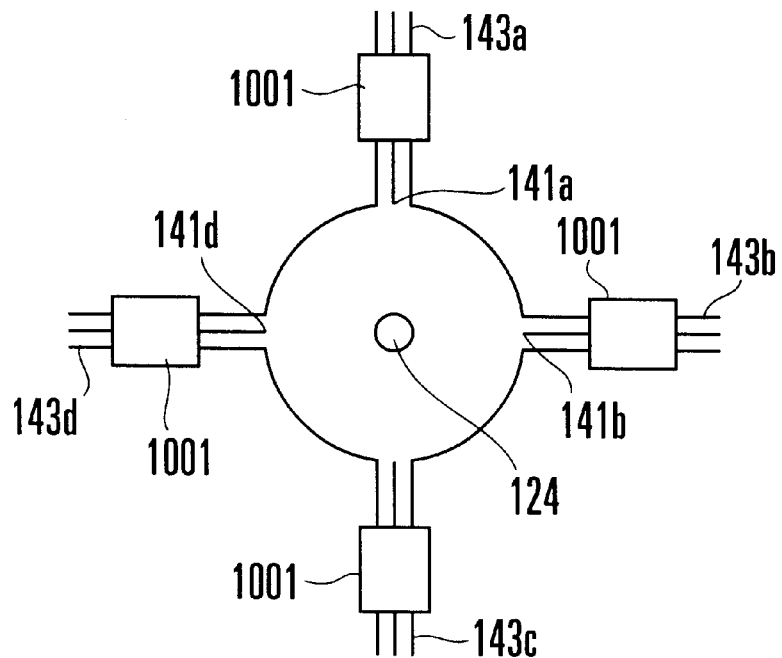
FIG. 10 is a structural drawing partially showing the configuration of a plasma processing device according to another embodiment of the present invention.
Figure 11:
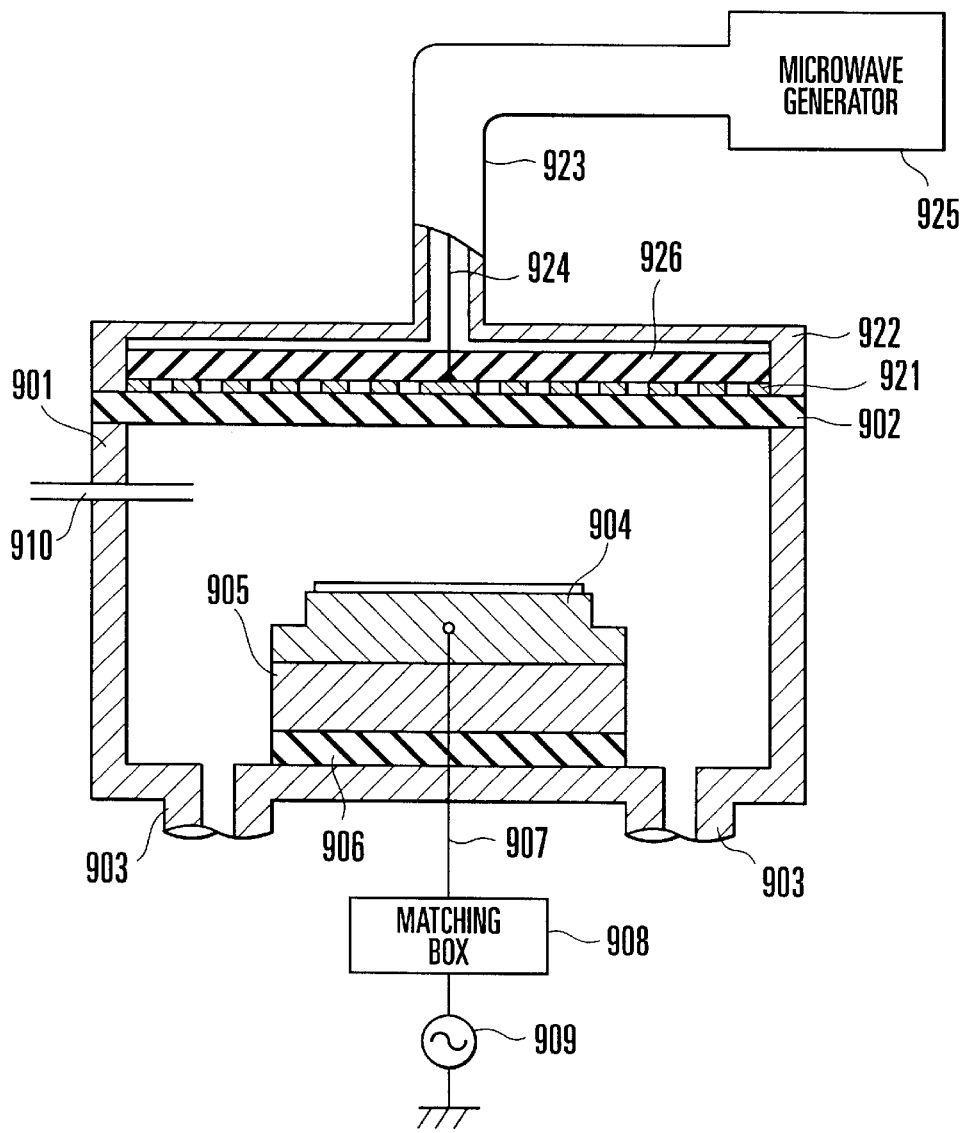
FIG. 11 is a sectional view showing the configuration of a conventional plasma processing device.

Besides, in the present embodiment, a case of using the plasma processing device of the present invention as the etching device is taken by way of one example. For example, it is certain that the present invention is applicable to other plasma processing devices such as a plasma CVD device. Further, as shown in FIG. 10, load matching devices 1001 may be respectively provided on the coaxial lines 143a to 143d connected to the first to fourth feeding sections 141a to 141d. Additionally, if a power detector, which is composed of a plurality of directional couplers, is further provided as an automatic load matching device, better results can be achieved.

As described above, according to the present invention, excellent effects can be obtained as follows: since a high-order mode is excited in the main coaxial line for feeding microwaves to the flat antenna, microwaves radiated from the flat antenna have even electric field components in a perpendicular direction, and plasma can be evenly generated using microwaves in the processing vessel.

What is claimed is:

1. A plasma processing device comprising:
   a loading base for loading a processed substrate placed in an airtight processing vessel;
   a flat antenna opposed to said loading base;
   a main coaxial line having one end connected to said flat antenna and the other end short-circuited;
   a plurality of feeding sections placed on said peripheral surface of said main coaxial line on the same plane perpendicular to an axial direction of said main coaxial line, said feeding sections receiving microwaves shifted in phase along the same circumferential direction; and
   microwave supply means for feeding microwaves with an equal prescribed frequency to said plurality of feeding sections.

2. The plasma processing device according to claim 1, wherein phase delay of said feeding section adjacent to another in the same circumferential direction is set at natural number-times as much as an angle of said feeding section and said adjacent feeding section, with respect to an intersection of a center line of said main coaxial line and the same plane having said feeding sections thereon.

3. The plasma processing device according to claim 2, wherein said feeding section and said adjacent feeding section have an angle of $\{360/(M+1)\}°$ (M is the number of feeding sections) or more with respect to the intersection of the center line of said main coaxial line and the same plane having said feeding sections thereon.

4. The plasma processing device according to claim 3 wherein said main coaxial line is short-circuited from said feeding sections at $(2N-1) \cdot \lambda_g/4$ (N is a natural number) where $\lambda_g$ is a wavelength of said main coaxial line of a microwave supplied by said microwave supply means.

5. The plasma processing device according to claim 4 wherein said microwave supply means are provided in the same number as said feeding sections so as to correspond to said feeding sections, and said microwave supply means are synchronized with each other to feed microwaves to said corresponding feeding sections.

6. The plasma processing device according to claim 3 wherein said microwave supply means are provided in the same number as said feeding sections so as to correspond to said feeding sections, and said microwave supply means are synchronized with each other to feed microwaves to said corresponding feeding sections.

7. The plasma processing device according to claim 2 wherein said feeding sections are evenly placed on the peripheral surface of said main coaxial line.

8. The plasma processing device according to claim 7 wherein said main coaxial line is short-circuited from said feeding sections at $(2N-1)\cdot\lambda_g/4$ (N is a natural number) where $\lambda_g$ is a wavelength of said main coaxial line of a microwave supplied by said microwave supply means.

9. The plasma processing device according to claim 8 wherein said microwave supply means are provided in the same number as said feeding sections so as to correspond to said feeding sections, and said microwave supply means are synchronized with each other to feed microwaves to said corresponding feeding sections.

10. The plasma processing device according to claim 7 wherein said microwave supply means are provided in the same number as said feeding sections so as to correspond to said feeding sections, and said microwave supply means are synchronized with each other to feed microwaves to said corresponding feeding sections.

11. The plasma processing device according to claim 7 wherein said feeding sections are evenly disposed on four parts of said peripheral surface of said main coaxial line, and
said microwave supply means includes:
a microwave generation source;
main branch means for branching a microwave outputted from said microwave generation source into two branched microwaves shifted in phase by 180°;
phase delay means for delaying one of said branched microwaves, which are branched by said branch means, in phase by 90° from the other branched microwave; and
two sub branch means for branching each of said branched microwaves into two supply microwaves shifted in phase by 180°, one of said branched microwaves being branched by said main branch means, the other branched microwave being delayed in phase by said phase delay means.

12. The plasma processing device according to claim 2 wherein said main coaxial line is short-circuited from said feeding sections at $(2N-1)\cdot\lambda_g/4$ (N is a natural number) where $\lambda_g$ is a wavelength of said main coaxial line of a microwave supplied by said microwave supply means.

13. The plasma processing device according to claim 12 wherein said microwave supply means are provided in the same number as said feeding sections so as to correspond to said feeding sections, and said microwave supply means are synchronized with each other to feed microwaves to said corresponding feeding sections.

14. The plasma processing device according to claim 2 wherein said microwave supply means are provided in the same number as said feeding sections so as to correspond to said feeding sections, and said microwave supply means are synchronized with each other to feed microwaves to said corresponding feeding sections.

15. The plasma processing device according to claim 1 wherein said feeding sections are evenly placed on the peripheral surface of said main coaxial line.

16. The plasma processing device according to claim 15 wherein said main coaxial line is short-circuited from said feeding sections at $(2N-1)\cdot\lambda_g/4$ (N is a natural number) where $\lambda_g$ is a wavelength of said main coaxial line of a microwave supplied by said microwave supply means.

17. The plasma processing device according to claim 16 wherein said microwave supply means are provided in the same number as said feeding sections so as to correspond to said feeding sections, and said microwave supply means are synchronized with each other to feed microwaves to said corresponding feeding sections.

18. The plasma processing device according to claim 15 wherein said microwave supply means are provided in the same number as said feeding sections so as to correspond to said feeding sections, and said microwave supply means are synchronized with each other to feed microwaves to said corresponding feeding sections.

19. The plasma processing device according to claim 15 wherein said feeding sections are evenly disposed on four parts of said peripheral surface of said main coaxial line, and
said microwave supply means includes:
a microwave generation source;
main branch means for branching a microwave outputted from said microwave generation source into two branched microwaves shifted in phase by 180°;
phase delay means for delaying one of said branched microwaves, which are branched by said branch means, in phase by 90° from the other branched microwave; and
two sub branch means for branching each of said branched microwaves into two supply microwaves shifted in phase by 180°, one of said branched microwaves being branched by said main branch means, the other branched microwave being delayed in phase by said phase delay means.

20. The plasma processing device according to claim 1 wherein said main coaxial line is short-circuited from said feeding sections at $(2N-1)\cdot\lambda_g/4$ (N is a natural number) where $\lambda_g$ is a wavelength of said main coaxial line of a microwave supplied by said microwave supply means.

21. The plasma processing device according to claim 20 wherein said microwave supply means are provided in the same number as said feeding sections so as to correspond to said feeding sections, and said microwave supply means are synchronized with each other to feed microwaves to said corresponding feeding sections.

22. The plasma processing device according to claim 1 wherein said microwave supply means are provided in the same number as said feeding sections so as to correspond to said feeding sections, and said microwave supply means are synchronized with each other to feed microwaves to said corresponding feeding sections.

* * * * *